United States Patent
Kim et al.

(10) Patent No.: US 11,408,072 B2
(45) Date of Patent: Aug. 9, 2022

(54) VAPOR DEPOSITION APPARATUS

(71) Applicant: SAMSUNG DISPLAY CO., LTD., Yongin-si (KR)

(72) Inventors: Jin-Kwang Kim, Yongin-si (KR); Seung-Yong Song, Yongin-si (KR); Myung-Soo Huh, Yongin-si (KR); Suk-Won Jung, Yongin-si (KR); Choel-Min Jang, Yongin-si (KR); Jae-Hyun Kim, Yongin-si (KR); Sung-Chul Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 401 days.

(21) Appl. No.: 16/271,189

(22) Filed: Feb. 8, 2019

(65) Prior Publication Data
US 2019/0169747 A1 Jun. 6, 2019

Related U.S. Application Data

(63) Continuation of application No. 14/161,984, filed on Jan. 23, 2014, now abandoned.

(30) Foreign Application Priority Data

Jul. 25, 2013 (KR) .................. 10-2013-0088266

(51) Int. Cl.
  *C23C 16/455* (2006.01)
(52) U.S. Cl.
  CPC .. *C23C 16/45574* (2013.01); *C23C 16/45536* (2013.01); *C23C 16/45551* (2013.01)

(58) Field of Classification Search
  CPC .............. H01L 33/56; C23C 16/45559; C23C 16/45591
  See application file for complete search history.

(56) References Cited

U.S. PATENT DOCUMENTS

| 5,445,709 A | 8/1995 | Kojima et al. |
| 5,647,945 A | 7/1997 | Matsuse et al. |

(Continued)

FOREIGN PATENT DOCUMENTS

| JP | 2005523580 A | 8/2005 |
| KR | 10-2004-0080593 A | 9/2004 |

(Continued)

OTHER PUBLICATIONS

Yong Ju Lee and Sang-Won Kang, Study on the characteristics of alumdinum thin films prepared by atomic layer deposition, Journal of Vacuum Science & Technology A, 20, 1983 (Year: 2002).*

(Continued)

*Primary Examiner* — Alex A Rolland
(74) *Attorney, Agent, or Firm* — Cantor Colburn LLP

(57) ABSTRACT

A vapor deposition apparatus for providing a deposition film on a substrate, the vapor deposition apparatus includes a plurality of first nozzle parts which injects a first raw material toward the substrate; a plurality of second nozzle parts which is alternately disposed together with the plurality of first nozzle parts and injects a second raw material toward the substrate; a diffuser unit which distributes the second raw material to the plurality of second nozzle parts; and a supply unit which supplies the second raw material to the diffuser unit.

9 Claims, 4 Drawing Sheets

(56) References Cited

U.S. PATENT DOCUMENTS

| | | | |
|---|---|---|---|
| 6,170,432 | B1 | 1/2001 | Szapucki et al. |
| 6,302,964 | B1 | 10/2001 | Umotoy et al. |
| 6,436,193 | B1 | 8/2002 | Kasai et al. |
| 7,468,494 | B2 | 12/2008 | Gonzalez et al. |
| 8,882,913 | B2 | 11/2014 | Byun et al. |
| 8,896,135 | B2 * | 11/2014 | Wang .................. C08F 8/42 257/788 |
| 2002/0129902 | A1 * | 9/2002 | Babayan ............... C23C 16/402 156/345.45 |
| 2003/0047282 | A1 * | 3/2003 | Sago .................. C23C 16/4557 156/345.34 |
| 2004/0067641 | A1 | 4/2004 | Yudovsky |
| 2004/0216668 | A1 | 11/2004 | Lindfors et al. |
| 2005/0217582 | A1 * | 10/2005 | Kim .................. C23C 16/4557 118/723 E |
| 2005/0223982 | A1 | 10/2005 | Park et al. |
| 2006/0174827 | A1 | 8/2006 | Bae et al. |
| 2006/0286775 | A1 | 12/2006 | Singh et al. |
| 2007/0181820 | A1 | 8/2007 | Hwang et al. |
| 2008/0081114 | A1 | 4/2008 | Johanson et al. |
| 2009/0095220 | A1 | 4/2009 | Meinhold et al. |
| 2009/0130858 | A1 | 5/2009 | Levy |
| 2010/0310771 | A1 | 12/2010 | Lee |
| 2012/0064260 | A1 * | 3/2012 | Suzuki .................. C23C 16/511 427/575 |
| 2012/0108066 | A1 | 5/2012 | New et al. |
| 2012/0213945 | A1 | 8/2012 | Lee |
| 2012/0225191 | A1 | 9/2012 | Yudovsky et al. |
| 2012/0263877 | A1 | 10/2012 | Strauch et al. |
| 2013/0008382 | A1 | 1/2013 | Hattori et al. |
| 2013/0105303 | A1 | 5/2013 | Lubomirsky et al. |
| 2014/0174362 | A1 | 6/2014 | Kao et al. |
| 2014/0299681 | A1 | 10/2014 | Kashyap et al. |
| 2015/0000596 | A1 | 1/2015 | Hsiau et al. |

FOREIGN PATENT DOCUMENTS

| | | |
|---|---|---|
| KR | 1020080025277 A | 3/2008 |
| KR | 1020100055618 A | 5/2010 |
| KR | 1020120027399 A | 3/2012 |

OTHER PUBLICATIONS

Korean Office Action for Application No. 10-2013-0088266 dated Mar. 31, 2020, citing the above reference(s).
Korean office action for application No. 10-2021-0002587 dated Feb. 23, 2021, citing the above reference(s). [statement under 37 CFR 1.97(e)(1) is attached].

* cited by examiner

VAPOR DEPOSITION APPARATUS

This application is a continuation of U.S. patent application Ser. No. 14/161,984, filed on Jan. 23, 2014, which claims priority to Korean Patent Application No. 10-2013-0088266, filed on Jul. 25, 2013, and all the benefits accruing therefrom under 35 U.S.C. § 119, the disclosure of which is incorporated herein in its entirety by reference.

BACKGROUND

1. Field

One or more exemplary embodiments of the invention relate to a vapor deposition apparatus, and more particularly, to a vapor deposition apparatus that is capable of improving deposition film properties and is easily maintained and repaired.

2. Description of the Related Art

Semiconductor devices, display apparatuses and other electronic devices generally include a plurality of thin films. Also, there are various methods of forming the plurality of thin films such as a vapor deposition method, for example.

The vapor deposition method uses one or more gases as a raw material for forming thin films. Such a vapor deposition method includes various methods such as chemical vapor deposition ("CVD") and atomic layer deposition ("ALD"), for example.

Among the various methods, in the ALD, one raw material is injected onto a substrate and then purged and pumped, to adsorb a single molecular layer or more layers, and then another raw material is injected onto the substrate and then purged and pumped to finally form a desired single atomic layer or a plurality of atomic layers.

Among display apparatuses, an organic light-emitting display apparatus has not only wide viewing angles and excellent contrasts but also fast response speed, and thus, is attracting attention as a next generation display apparatus.

The organic light-emitting display apparatus respectively includes an intermediate layer including an organic emission layer between a first electrode and a second electrode facing each other and one or more various thin films. In this case, to form thin films of the organic light-emitting display apparatus, deposition processes may be used.

SUMMARY

As an organic light-emitting display apparatus has become larger and higher resolution is necessary, it is difficult to deposit large-sized thin films with desired properties. Also, there is a limitation to improve the efficiency of processes of forming such thin films.

One or more exemplary embodiments of the invention include a vapor deposition apparatus that is capable of improving deposition film properties and is easily maintained and repaired.

Additional exemplary embodiments will be set forth in part in the description which follows and, in part, will be apparent from the description, or may be learned by practice of the exemplary embodiments.

According to one or more exemplary embodiments of the invention, there is provided a vapor deposition apparatus which provides a deposition film on a substrate. The vapor deposition apparatus includes a plurality of first nozzle parts which injects a first raw material toward the substrate, a plurality of second nozzle parts which is alternately disposed with the plurality of first nozzle parts and injects a second raw material toward the substrate, a diffuser unit which distributes the second raw material to the plurality of second nozzle parts, and a supply unit which supplies the second raw material to the diffuser unit.

In an exemplary embodiment, the diffuser unit may include an upper plate, a lower plate, and a plurality of distribution plates deposited between the upper plate and the lower plate to be substantially parallel to one another, and the plurality of distribution plates may be separated from one another.

In an exemplary embodiment, holes through which the second raw material passes may be defined in each of the plurality of distribution plates, and a number of first holes defined in a first distribution plate disposed nearer to the supply unit than other distribution plates may be smaller than a number of second holes defined in a second distribution plate disposed nearer the second nozzle part than other distribution plates.

In an exemplary embodiment, a size of each of the first holes may be larger than a size of each of the second holes.

In an exemplary embodiment, an entire area of the second holes may be larger than an entire area of the first holes.

In an exemplary embodiment, a plurality of slits corresponding to the plurality of second nozzle parts may be defined in the lower plate.

In an exemplary embodiment, the plurality of distribution plates may be coupled with the diffuser unit to be detachable.

In an exemplary embodiment, the vapor deposition apparatus may further include a chamber including the first nozzle parts, the second nozzle parts, the diffuser unit, the supply unit and the substrate. In this case, the diffuser unit may be in thermal contact with the chamber.

In an exemplary embodiment, the vapor deposition apparatus may further include an exhaust unit and a purge unit disposed between the first nozzle part and the second nozzle part.

In an exemplary embodiment, the supply unit may include a plasma generation part.

In an exemplary embodiment, the substrate and the vapor deposition apparatus may move relative to the vapor deposition apparatus.

In an exemplary embodiment, the first raw material may be supplied to the first nozzle parts in a substantially horizontal direction and the second raw material may be supplied to the second nozzle parts in a substantially perpendicular direction.

According to one or more embodiments of the invention, there is provided a vapor deposition apparatus which provides a deposition film on a substrate. The vapor deposition apparatus includes a deposition unit including a plurality of first nozzle parts which injects a first raw material toward the substrate and a plurality of second nozzle parts which is alternately disposed with the plurality of first nozzle parts and injects a second raw material toward the substrate, a diffuser unit which is coupled with the deposition unit and distributes the second raw material to the plurality of second nozzle parts, and a supply unit which supplies the second raw material to the diffuser unit. The diffuser unit includes an upper plate, a lower plate, and a plurality of distribution plates deposited between the upper plate and the lower plate to be substantially parallel to one another, and a plurality of slits corresponding to the plurality of second nozzle parts is defined in the lower plate.

In an exemplary embodiment, the plurality of distribution plates may be separated from one another, and holes through which the second raw material passes may be defined in each of the plurality of distribution plates.

In an exemplary embodiment, a number of first holes defined in a first distribution plate disposed nearer to the supply unit than other distribution plates may be smaller than a number of second holes defined in a second distribution plate disposed nearer the second nozzle part than the other distribution plates.

In an exemplary embodiment, a size of each of the first holes may be larger than a size of each of the second holes and an entire area of the second holes may be larger than an entire area of the first holes.

In an exemplary embodiment, the supply unit may include a plasma generation part.

In an exemplary embodiment, the plurality of distribution plates may be coupled with the diffuser unit to be detachable.

In an exemplary embodiment, the vapor deposition apparatus may further include an exhaust unit and a purge unit disposed between the first nozzle part and the second nozzle part.

In an exemplary embodiment, the first raw material may be supplied to the plurality of first nozzle parts in a substantially horizontal direction and the second raw material may be supplied to the plurality of second nozzle parts in a substantially perpendicular direction.

BRIEF DESCRIPTION OF THE DRAWINGS

These and/or other exemplary embodiments will become apparent and more readily appreciated from the following description of the exemplary embodiments, taken in conjunction with the accompanying drawings of which.

DETAILED DESCRIPTION

Figure 1:
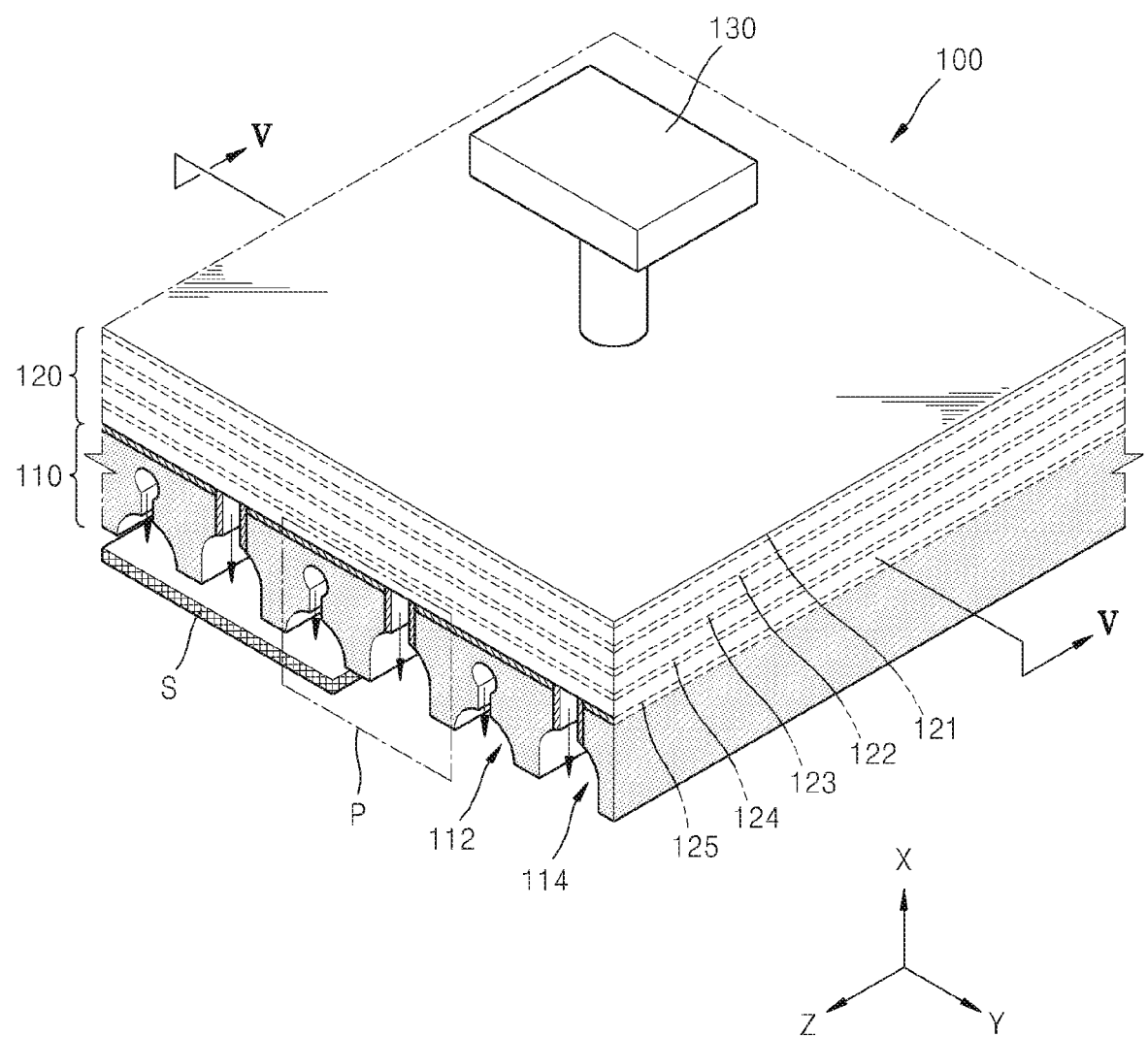
FIG. 1 is a partial perspective view illustrating an exemplary embodiment of a vapor deposition apparatus according to the invention.

Reference will now be made in detail to exemplary embodiments, examples of which are illustrated in the accompanying drawings, where like reference numerals refer to like elements throughout. In this regard, the exemplary embodiments may have different forms and should not be construed as being limited to the descriptions set forth herein. Accordingly, the exemplary embodiments are merely described below, by referring to the figures, to explain exemplary embodiments of the invention.

Since the invention may have various modifications and exemplary embodiments, exemplary embodiments are shown in the drawings and will be described in detail. However, this is not to limit the invention to the exemplary embodiments but should be understood as including all modifications, equivalents, and substitutes included in the spirit and the scope of the invention. While describing the exemplary embodiments, when it is determined that a detailed description of well-known typical art may make the points of the exemplary embodiment unclear, the detailed description thereof will be omitted.

It will be understood that when an element is referred to as being "on" another element, it can be directly on the other element or intervening elements may be present therebetween. In contrast, when an element is referred to as being "directly on" another element, there are no intervening elements present.

It will be understood that although the terms "first", "second", etc. may be used herein to describe various components, these components should not be limited by these terms. These terms are only used to distinguish one component from another.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. As used herein, "connected" may be used to refer to elements being physically, electrically and/or fluidly in connection.

Terms are used herein only to describe the exemplary embodiments but not to limit the invention. Singular expressions, as not clearly described to be different in contexts, include plural expressions. In the specification, terms of "comprise" or "have" are used to designate features, numbers, steps, operations, elements, components or combinations thereof disclosed in the specification as being present but not to exclude possibility of the existence or the addition of one or more other features, numbers, steps, operations, elements, components, or combinations thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, the exemplary embodiments of the invention will be described in detail with reference to the attached drawings.

Figure 2:
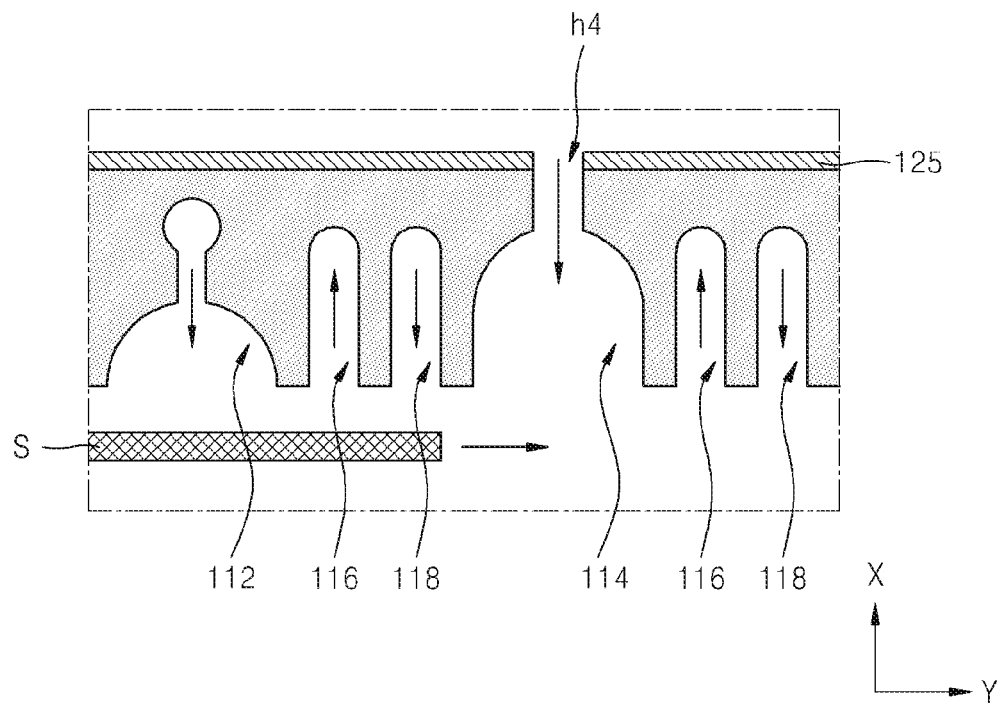
FIG. 2 is an enlarged view illustrating a part P shown in FIG. 1.
Figure 3:
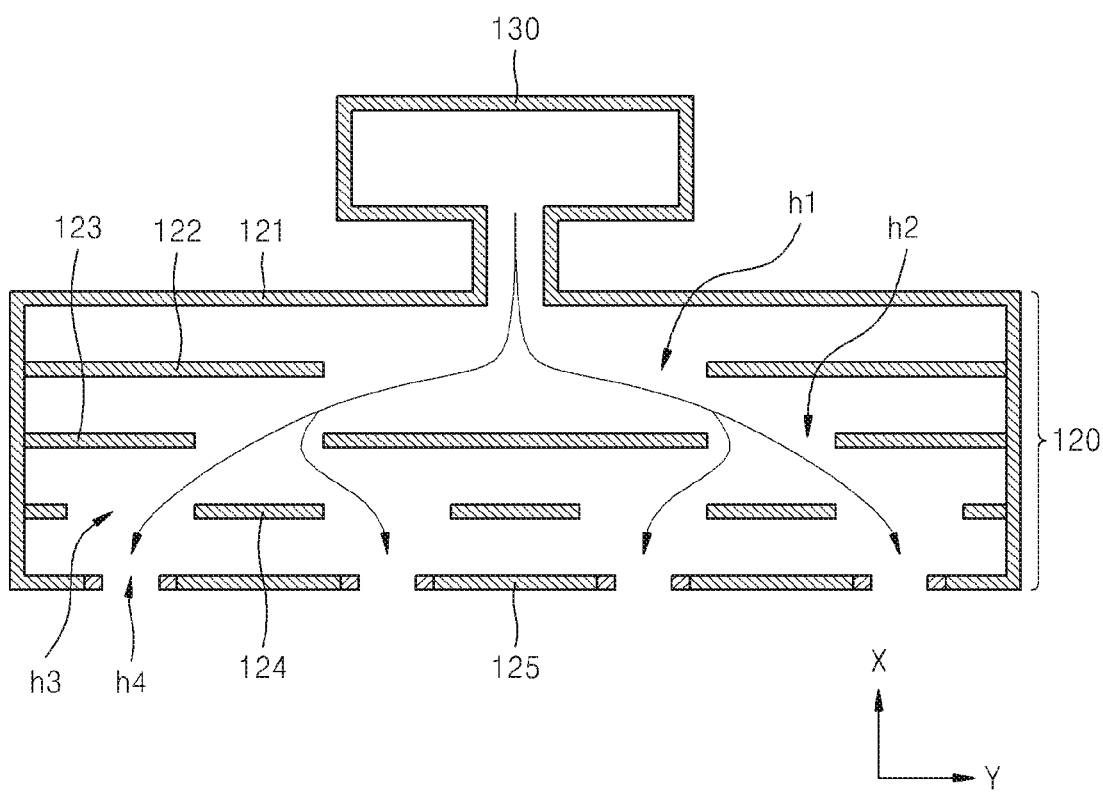
FIG. 3 is a cross-sectional view illustrating a diffuser unit and a supply unit in a cross-section along line V-V of the vapor deposition apparatus of FIG. 1.

FIG. 1 is a partial perspective view illustrating a vapor deposition apparatus 100 according to an exemplary embodiment of the invention, FIG. 2 is an enlarged view illustrating a part P shown in FIG. 1, FIG. 3 is a cross-sectional view illustrating a diffuser unit 120 and a supply unit 130 in a cross-section along line V-V of the vapor deposition apparatus 100, and FIGS. 4A to 4D are top views illustrating distribution plates 122 to 124 and a lower plate 125 of the diffuser unit 120 of the vapor deposition apparatus 100.

Referring to FIGS. 1 to 4, the vapor deposition apparatus 100 may include a deposition unit 110, the diffuser unit 120, and the supply unit 130. Also, although not shown in the drawings, in an exemplary embodiment, the vapor deposition apparatus 100 may include a chamber (not shown) in which a substrate S is contained and the deposition unit 110, for example.

In the exemplary embodiment, the chamber may be connected to a pump (not shown) to control a pressure atmosphere of a deposition process and may include one or more gates (not shown) through which the substrate S may enter and exit. Also, the chamber may include a driving stage (not shown) for transferring the substrate S.

The deposition unit 110 supplies one or more raw materials toward the substrate S to allow a deposition process to be performed on the substrate S. In more detail, the deposition unit 110 may include a plurality of first nozzle parts 112 and a plurality of second nozzle parts 114 alternately disposed with the plurality of first nozzle parts 112. Referring to FIG. 2, the deposition unit 110 may further include an exhaust unit 116 and a purge unit 118 located between the first nozzle part 112 and the second nozzle part 114 which are adjacent to each other.

The first nozzle parts 112 inject a first raw material toward the substrate S. The first raw material may be supplied from a supply tank (not shown) to the first nozzle parts 112, whereby the first raw material is supplied to the first nozzle parts 112 in a substantially horizontal direction. That is, the first raw material supplied to the first nozzle parts 112 in a direction substantially parallel to the substrate S may be injected by the first nozzle parts 112 toward the substrate S. In one exemplary embodiment, for example, horizontal channels may be defined in the deposition unit 110 and connected to the first nozzle parts 112, such that the first raw material flows substantially parallel to the substrate and is then injected by the first nozzle parts 112 and toward the substrate S. FIG. 1 and FIG. 2 illustrate a cross-sectional view of the channels, but the configuration is not limited thereto.

The second nozzle parts 114 inject a second raw material toward the substrate S, and the second raw material is distributed to the second nozzle parts 114 by the diffuser unit 120. Since the diffuser unit 120 may be disposed on a top surface of the deposition unit 110, the second raw material may be supplied to the second nozzle parts 114 in a substantially perpendicular direction. That is, the second raw material may be supplied to the second nozzle parts 114 in the same direction in which it is injected onto the substrate S.

The second raw material may have radical form that is easily extinctive. Accordingly, when the second raw material is supplied to the second nozzle parts 114 in the substantially perpendicular direction, a transfer path of the second raw material may be reduced, thereby effectively reducing extinction of the second raw material. Also, since the second raw material may be uniformly distributed to the second nozzle parts 114 by the diffuser unit 120, properties of a thin film disposed on the substrate S may be easily improved. This will be described in further detail below with reference to FIGS. 3 and 4.

The purge unit 118 injects a purge gas toward the substrate S. The purge gas may be a gas having no effect on deposition, for example, argon or nitrogen gas.

When the purge gas is injected onto the substrate S by the purge unit 118, one of the first raw material and the second raw material, which is unresponsive to the deposition of a thin film, and by-products remaining during a deposition process, may be physically separated from the substrate S.

The exhaust unit 116 is located subsequent to one of the first nozzle part 112 and the second nozzle part 114 based on a transfer direction of the substrate S in the drawings and exhausts by-products, extra gases, etc. separated from the substrate S by the purge unit 118.

Hereinafter, referring to FIG. 2, a method of providing a thin film on the substrate S will be described in brief. FIG. 2 illustrates an exemplary embodiment in which the thin film is disposed on the substrate S while the substrate S is transferred below the deposition unit 110 in one direction. Also, the thin film disposed on the substrate S includes AlxOy.

The substrate S, on which deposition is performed, is disposed to correspond to a first nozzle part 112, and then, the first nozzle part 112 injects the first raw material toward the substrate S. The first raw material may include a gas including Aluminum (Al) atoms such as gaseous trimethyl aluminum ("TMA"), for example. Thus, an adsorption layer including Aluminum (Al) is disposed on a top surface of the substrate S, in which the adsorption layer may include a chemical adsorption layer and a physical adsorption layer.

In the adsorption layer disposed on the top surface of the substrate S, the physical adsorption layer, whose binding force between molecules is low, is separated from the substrate S by the purge gas injected by the purge unit 118 located subsequent to the first injection unit 112 based on a progress direction of the substrate S. Also, the physical adsorption layer separated from the substrate S may be effectively removed from the substrate S by pumping of the exhaust unit 116 located subsequent to the first nozzle part 112 based on the progress direction of the substrate S.

When the substrate S is disposed to correspond to the second nozzle part 114, the second raw material is injected toward the substrate S through the second nozzle part 114. The second raw material may include radical elements. In an exemplary embodiment, the second raw material may include oxygen radicals. The oxygen radicals may be provided by injecting $H_2O$, $O_2$, $N_2O$, etc. into a plasma generation part (not shown) of the supply unit 130 described below.

The second raw material may react with the chemical adsorption layer including the first raw material previously adsorbed onto the substrate S or may substitute a part of the chemical adsorption layer, thereby finally providing a desired deposition layer, for example, an $Al_xO_y$ layer. An excess of the second raw material may provide the physical adsorption layer and may remain on the substrate S.

The physical adsorption layer of the second raw material remaining on the substrate S may be separated from the substrate S by the purge gas injected by the purge unit 118 located subsequent to the second nozzle part 114 based on the progress direction of the substrate S and may be effectively removed from the substrate S throughout the substrate S by being pumped away by the exhaust unit 116 located subsequent to the second nozzle part 114 based on the progress direction of the substrate S. Accordingly, while the substrate S is passing below the deposition unit 110, a desired single atomic layer may be disposed on the substrate S.

In FIG. 2, the deposition process is performed while the substrate S moves relative to the deposition unit 110. In the illustrated exemplary embodiment, the substrate S is passing below the deposition unit 110 but is not limited thereto. In an exemplary embodiment, during the deposition process, the substrate S may reciprocate below the deposition unit 110 or a location of the substrate S may be fixed and the deposition unit 110 may be transferred to perform continuous deposition processes.

The diffuser unit 120 distributes the second raw material to the second nozzle parts 114. Also, the supply unit 130 supplies the second raw material to the diffuser unit 120.

The supply unit 130 may be located inside or outside the chamber and may include the plasma generation part for generating plasma.

The plasma generation part may include a plasma generator (not shown), to which a voltage is applied, and a corresponding surface (not shown) providing a plasma generation space (not shown) together with the plasma generator. In an exemplary embodiment, the corresponding surface may be a grounded electrode. A pulse voltage is applied to the plasma generator to generate an electric potential difference between the plasma generator and the corresponding surface, and the second raw material is injected into the plasma generation space, thereby allowing the second raw material to become radical form. The second raw material in a radical form is supplied to the diffuser unit 120.

In an exemplary embodiment, the diffuser unit 120 may be coupled to the deposition unit 110. In an alternative, exemplary embodiment, the diffuser unit 120 may be provided as a single body together with the deposition unit 110. Also, the diffuser unit 120 may be in thermal contact with the chamber and may easily diffuse heat inside the chamber.

The diffuser unit 120 may uniformly distribute the second raw material in a radical form to the second nozzle parts 114.

In an exemplary embodiment, the diffuser unit 120 may include an upper plate 121, the lower plate 125, and a plurality of distribution plates 122 to 124 between the upper plate 121 and the lower plate 125. In an exemplary embodiment in FIG. 3, the diffuser unit 120 includes three distribution plates 122 to 124, but is not limited thereto. That is, considering a reduction of the transfer path of the second raw material and uniform distribution of the second raw material to the second nozzle parts 114, the diffuser unit 120 may include various numbers of distribution plates.

The upper plate 121 and the lower plate 125 may provide an exterior of the diffuser unit 120. The upper plate 121 is connected to the supply unit 130, and an opening (not shown) may be defined in the upper plate 121 to allow the second raw material supplied by the supply unit 130 to flow into the diffuser unit 120. A plurality of slits h4 corresponding to the second nozzle parts 114 may be defined in the lower plate 125. In an exemplary embodiment, a shape of each slit h4 may be defined to be same as a shape of a top surface of the second nozzle part 114.

The plurality of distribution plates 122 to 124 is deposited in substantially parallel to one another between the upper plate 121 and the lower plate 125. Also, the plurality of distribution plates 122 to 124 is arranged to be separated from one another and holes h1 to h3 may be defined in the plurality of distribution plates 122 to 124, respectively, through which the second raw material passes. Accordingly, the plurality of distribution plates 122 to 124 controls the transfer path of the second raw material while the second raw material is being transferred from the upper plate 121 to the lower plate 125, thereby allowing an amount of the second raw material passing through the respective slits h4 to be uniform.

Hereinafter, for convenience of description, as shown in the drawings, the plurality of distribution plates 122 to 124 will be also referred to as a first distribution plate 122, a second distribution plate 123 and a third distribution plate 124, respectively.

Figure 4A:
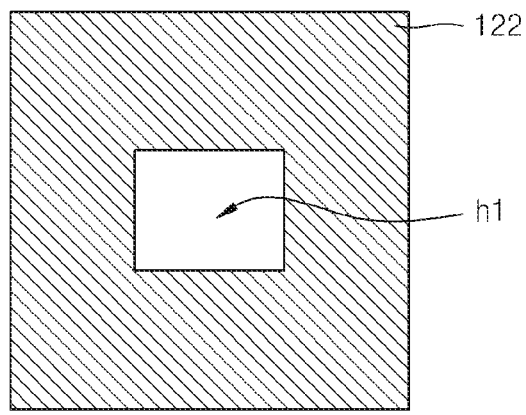
FIGS. 4A to 4D are top views illustrating distribution plates and a lower plate of the diffuser unit of the vapor deposition apparatus of FIG. 1.
Figure 4B:
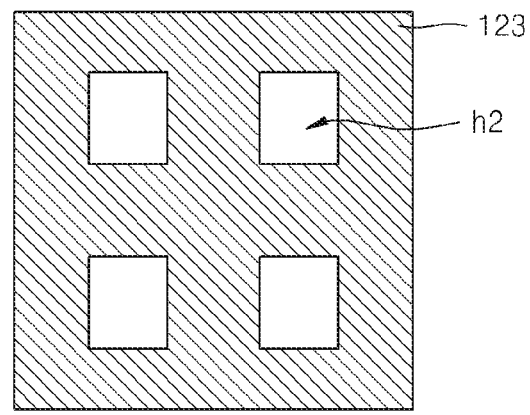
Figure 4C:
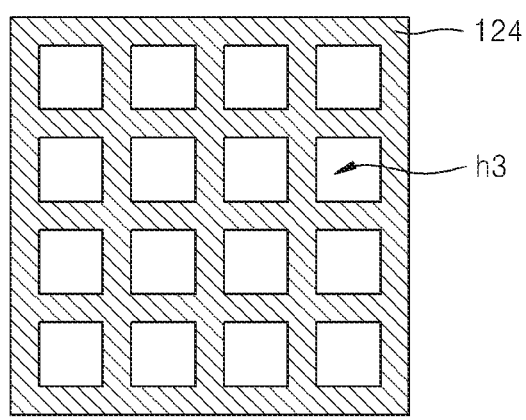
Figure 4D:
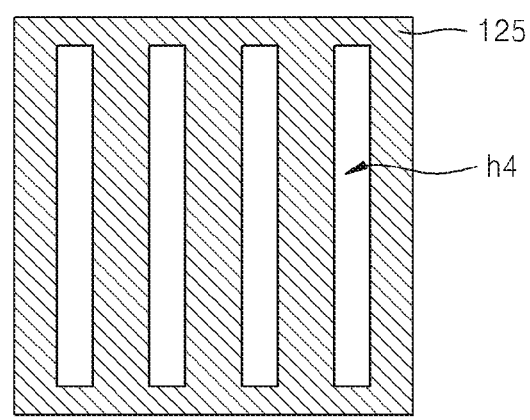

FIGS. 4A to 4D are top views illustrating the distribution plates 122 to 124 and the lower plate 125 of the diffuser unit 120, respectively. FIG. 4A is a top view illustrating the first distribution plate 122, FIG. 4B is a top view illustrating the second distribution plate 123, FIG. 4C is a top view illustrating the third distribution plate 124, and FIG. 4D is a top view illustrating the lower plate 125. Also, as shown in FIG. 3, the first distribution plate 122 is disposed being nearest to the supply unit 130 and the third distribution plate 124 is disposed being nearest to the second nozzle part 114.

Comparing the first distribution plate 122 with the second distribution plate 123, a number of first holes h1 defined in the first distribution plates 122 disposed being nearer to the supply unit 130 than the second distribution plate 123 may be smaller than a number of second holes h2 defined in the second distribution plate 123. Also, an entire (e.g., total) area of the second holes h2 may be provided to be larger than an entire (e.g., total) area of the first holes h1.

In an exemplary embodiment, to allow the second raw material passing through the first hole h1 to enter the second holes h2 having a uniform mean transfer distance, since distances between the first hole h1 and the respective second holes h2 are to be identical to one another, the first hole h1 may be located to correspond to a central portion of the second holes h2. Also, to allow a larger amount of the second raw material to pass, a size of the first hole h1 may be larger than that of each of the second holes h2.

When the first hole h1 and the second holes h2 are defined as described above, the second raw material may be evenly and broadly diffused in the diffuser unit 120 as passing through the second distribution plate 123.

Similarly, the number of the second holes h2 defined in the second distribution plate 123 disposed being nearer to the supply unit 130 than the third distribution plate 124 may be smaller than a number of the third holes h3 defined in the third distribution plate 124. Also, a size of each of the second holes h2 may be larger than a size of each of the third holes h3, and an entire area of the third holes may be larger than an entire area of the second holes h2.

In an exemplary embodiment, to allow the second raw material to enter the third holes h3 having a uniform mean transfer distance, any one of the second holes h2 may be located to correspond to a center portion of the third holes h3 defined in a periphery thereof. Accordingly, when transferred toward the lower plate 125, the second raw material may be evenly distributed throughout the entire area of the diffuser unit 120.

The second raw material diffused in the diffuser unit 120 as described above may uniformly pass through the slits h4 of the lower plate 125, and as a result thereof, the diffuser unit 120 may uniformly distribute the second raw material to the second nozzle parts 114. Accordingly, the vapor deposition apparatus 100 may provide a thin film having uniform properties.

In the illustrated exemplary embodiment shown in FIGS. 3 to 4D, the numbers of the first to third holes h1 to h3 defined in the first to third distribution plates 122 to 124 increase by four times, respectively, from the first plate 122 to the third distribution plate 124, but are not limited thereto. In other exemplary embodiments, from the first distribution plate 122 to the third distribution plate 124, the numbers of the holes defined in the respective distribution plates 122 to 124 may increase N times or may irregularly increase.

As described above, the second raw material is allowed to become radical form while passing through the plasma generation part in the supply unit 130. In this case, ions and electrons exist in the plasma together with the second raw material in a radical form, which may cause damage to the substrate S.

However, according to the exemplary embodiment, the plasma generation part is provided to be separated from a deposition space and ions and electrons in the plasma may be filtered by the distribution plates 122 to 124 while being transferred in the diffuser unit 120. To accomplish this, the distribution plates 122 to 124 may be electrified. Accordingly, only the second raw material in a radical form, which has a neutral polarity, may join in the deposition process, thereby effectively preventing damage to a surface of the substrate S caused by ions and electrons.

Also, since the second raw material is supplied to the second nozzle parts 114 in a substantially perpendicular direction, the transfer path of the second raw material may be reduced. Accordingly, the extinction of the second raw material in a radical form may be effectively reduced, thereby improving efficiency of a thin film forming process.

In addition, since the second raw material uniformly distributed to the second nozzle parts 114 is provided by one supply unit 130, the second raw material injected by the respective second nozzle parts 114 may have similar or identical properties, thereby easily improving properties of a thin film disposed on the substrate S.

In an exemplary embodiment, the plurality of distribution plates 122 to 124 may include a material having excellent corrosion resistance and may be detachably coupled to the diffuser unit 120. Accordingly, the plurality of distribution plates 122 to 124 may be periodically replaced and dust particles collected by the plurality of distribution plates 122 to 124 may be easily removed. Accordingly, the vapor deposition apparatus 100 may be easily maintained and repaired.

Figure 5:
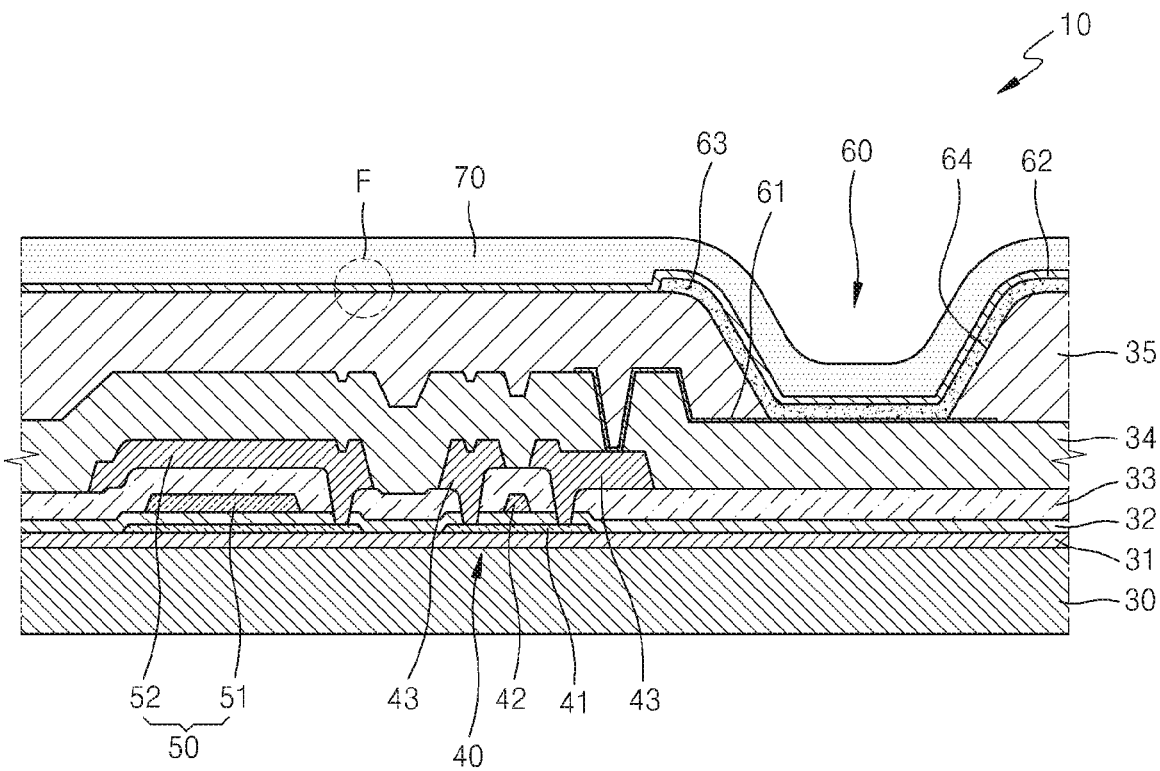
FIG. 5 is a cross-sectional view illustrating an exemplary embodiment of an organic light emitting display apparatus manufactured by using a method of manufacturing an organic light emitting display apparatus according to the invention.
Figure 6:
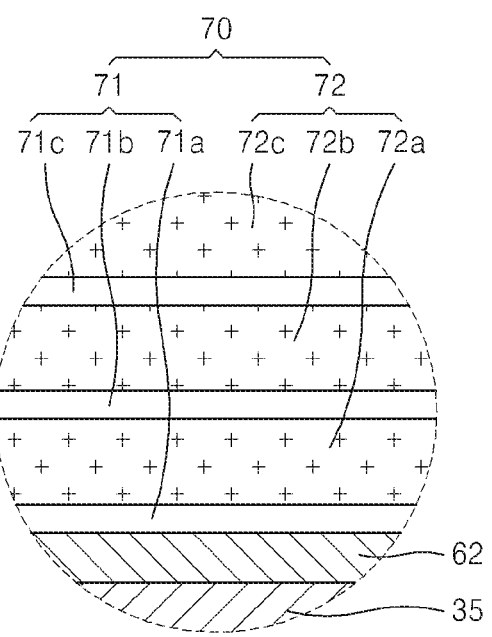
FIG. 6 is an enlarged view illustrating a part F shown in FIG. 5.

FIG. 5 is a cross-sectional view illustrating an organic light emitting display apparatus manufactured by using a method of manufacturing an organic light emitting display apparatus according to an exemplary embodiment of the invention, and FIG. 6 is an enlarged view illustrating a part F shown in FIG. 5.

In detail, FIGS. 5 and 6 illustrate an organic light emitting display apparatus 10 manufactured by using the vapor deposition apparatus 100.

The organic light emitting display apparatus 10 is disposed on a substrate 30. The substrate 30 may include one of a glass material, a plastic material, and a metallic material.

A flat surface is provided on a top surface of the substrate 30, and a buffer layer 31 including an insulating material to effectively prevent penetration of water and foreign bodies is provided toward the substrate 30.

On the buffer layer 31, a thin film transistor ("TFT") 40, a capacitor 50, and an organic light emitting device ("OLED") 60 are provided. The TFT 40, largely, includes an active layer 41, a gate electrode 42, and source/drain electrodes 43. The OLED 60 includes a first electrode 61, a second electrode 62 and an intermediate layer 63.

The capacitor 50 includes a first capacitor electrode 51 and a second capacitor electrode 52.

In detail, the active layer provided as a certain pattern is disposed on a top surface of the buffer layer 31. The active layer 41 may include one of an inorganic semiconductor material such as silicon, an organic semiconductor material and an oxide semiconductor material and may be provided by injecting a p-type or n-type dopant. The first capacitor electrode 51 is disposed on the same layer as the active layer 41 and may include a material similar or identical to that providing the active layer 41.

A gate insulating layer 32 is disposed on a top surface of the active layer 41. The gate electrode 42 is disposed on a top surface of the gate insulating layer 32 to correspond to the active layer 41. An interlayer dielectric 33 is provided to cover the gate electrode 42, and the source/drain electrodes 43 are disposed on the interlayer dielectric 33 to be in contact with a certain area of the active layer 41. The second capacitor electrode 52 is disposed in and/or on the same layer as the source/drain electrodes 43 and may include a material similar or identical to that providing the source/drain electrodes 43.

A passivation layer 34 is provided to cover the source/drain electrodes 43, and an additional insulating layer may be further provided to planarize the TFT 40.

The first electrode 61 is disposed on the passivation layer 34. The first electrode 61 may be provided to be electrically connected to any one of the source/drain electrodes 43. Also, a pixel defining layer 35 is provided to cover the first electrode 61. An opening 64 is defined in the pixel defining layer 35, and then the intermediate layer 63 including an organic emission layer is disposed in an area defined by the opening 64. The second electrode 62 is disposed on the intermediate layer 63.

An encapsulation layer 70 is disposed on the second electrode 62. The encapsulation layer 70 may include an organic material or an inorganic material and may have a structure provided by alternately depositing the organic material and inorganic material.

The encapsulation layer 70 may be provided by using the vapor deposition apparatus 100. That is, a desired layer may be provided by allowing the substrate 30 provided with the second electrode 62 to pass through the vapor deposition apparatus 100.

Particularly, the encapsulation layer 70 includes an inorganic layer 71 and an organic layer 72. The inorganic layer 71 includes a plurality of layers 71a, 71b and 71c, and the organic layer 72 includes a plurality of layers 72a, 72b, and 72c. In this case, the plurality of layers 71a, 71b, and 71c of the inorganic layer 71 may be provided by using the vapor deposition apparatus 100.

However, the exemplary embodiment is not limited thereto. That is, other insulating layers of the organic light emitting display apparatus 10 such as the buffer layer 31, the gate insulating layer 32, the interlayer dielectric 33, the passivation layer 34 and the pixel defining layer 35 may be provided by using the vapor deposition apparatus 100.

Also, other various thin films such as the active layer 41, the gate electrode 42, the source/drain electrodes 43, the first electrode 61, the intermediate layer 63 and the second electrode 62 may also be provided by using the vapor deposition apparatus 100.

As described above, when using the vapor deposition apparatus 100, electric properties and image quality of the organic light emitting display apparatus 10 may be enhanced by improving properties of deposition films disposed on the organic light emitting display apparatus 10.

As described above, according to the one or more of the above exemplary embodiments of the invention, since the vapor deposition apparatus may uniformly inject a raw material such as gas, properties of deposition films to be provided may be improved.

Also, since distribution plates in a diffuser are detachably coupled, the vapor deposition apparatus may be easily maintained and repaired.

It should be understood that the exemplary embodiments described herein should be considered in a descriptive sense only and not for purposes of limitation. Descriptions of features or exemplary embodiments within each exemplary embodiment should typically be considered as available for other similar features or exemplary embodiments in other exemplary embodiments.

While one or more exemplary embodiments of the invention have been described with reference to the figures, it will be understood by those of ordinary skill in the art that various changes in form and details may be made therein without departing from the spirit and scope of the invention as defined by the following claims.

What is claimed is:

1. A method of manufacturing a display device, the method comprising:
    locating a substrate on which an organic light emitting device is provided below a deposition unit; and
    forming an encapsulation layer on the substrate, wherein the encapsulation layer comprises an inorganic layer and an organic layer;
    wherein forming the inorganic layer comprising:
        injecting a first raw material toward the substrate by a first nozzle of the deposition unit to form an adsorption layer comprising a chemical adsorption layer and a physical adsorption layer on the substrate;
        injecting a purge gas toward the substrate by a first purge nozzle of the deposition unit to separate the physical adsorption layer from the substrate; and
        injecting a second raw material toward the substrate by a second nozzle of the deposition unit and through holes defined in a plurality of distribution plates of a diffuser unit disposed on the deposition unit, the second raw material react with the chemical adsorption layer to form a thin film on the substrate,
    wherein the second raw material is supplied, in a radical form having a neutral polarity, to the diffuser unit from a supply unit including a plasma generating part,
    wherein each of the plurality of distribution plates is electrified, and
    wherein the second raw material supplied to the diffuser is injected, in the radical form having the neutral polarity, into the second nozzle through the holes defined in the plurality of distribution plates.

2. The method of manufacturing the display device as claimed in claim 1, wherein the second raw material in the radical form passes through the diffuser unit and is supplied to the second nozzle in a vertical direction.

3. The method of manufacturing the display device as claimed in claim 2, wherein
    the plurality of distribution plates is separated from each other in the vertical direction,
    the second raw material in the radical form passes the through holes defined in the plurality of distribution plates and is supplied to the second nozzle.

4. The method of manufacturing the display device as claimed in claim 3, wherein
    a number of the holes defined in the plurality of distribution plates increases from an upper portion to a lower portion of the diffuser unit,
    a size of the holes defined in the plurality of distribution plates decreases from the upper portion to the lower portion of the diffuser unit.

5. The method of manufacturing the display device as claimed in claim 4, wherein the second raw material in the radical form passes the through holes defined in the plurality of distribution plates with a uniform mean transfer distance.

6. The method of manufacturing the display device as claimed in claim 2, wherein the second raw material in the radical form has the radical form before supplied to the diffuser unit.

7. The method of manufacturing the display device as claimed in claim 1, wherein the substrate reciprocates below the deposition unit.

8. The method of manufacturing the display device as claimed in claim 1, further comprising injecting the purge gas toward the substrate by a second purge nozzle of the deposition unit to remove by-products from the thin film.

9. The method of manufacturing the display device as claimed in claim 1, wherein the second raw material comprises an oxygen radical.

* * * * *